(12) United States Patent
Stotzing

(10) Patent No.: US 7,737,247 B2
(45) Date of Patent: Jun. 15, 2010

(54) POLYMERS OF THIENO[3,4-B]FURAN, METHOD OF MAKING, AND USE THEREOF

(75) Inventor: Gregory A. Stotzing, Storrs, CT (US)

(73) Assignee: The University of Connecticut, Farmington, CT (US)

( * ) Notice: Subject to any disclaimer, the term of this patent is extended or adjusted under 35 U.S.C. 154(b) by 975 days.

(21) Appl. No.: 11/456,606

(22) Filed: Jul. 11, 2006

(65) Prior Publication Data

US 2010/0113727 A1    May 6, 2010

Related U.S. Application Data

(60) Provisional application No. 60/698,050, filed on Jul. 11, 2005.

(51) Int. Cl.
 C08G 75/06 (2006.01)
 C08F 283/00 (2006.01)
 C08L 81/02 (2006.01)

(52) U.S. Cl. .................. 528/377; 528/425; 525/535; 524/817; 429/13; 429/40

(58) Field of Classification Search ................ 528/377, 528/425; 525/535; 524/817; 429/13, 40
See application file for complete search history.

(56) References Cited

U.S. PATENT DOCUMENTS

| | | | |
|---|---|---|---|
| 4,639,328 A | 1/1987 | Krause et al. | |
| 4,663,001 A | 5/1987 | Lazzaroni et al. | |
| 4,910,645 A | 3/1990 | Jonas et al. | |
| 4,959,430 A | 9/1990 | Jonas et al. | |
| 4,986,886 A | 1/1991 | Wei et al. | |
| 5,109,070 A | 4/1992 | Epstein et al. | |
| 5,300,575 A | 4/1994 | Jonas et al. | |
| 5,561,030 A | 10/1996 | Holdcroft et al. | |
| 5,691,062 A | 11/1997 | Shalaby et al. | |
| 6,194,540 B1 | 2/2001 | Ito et al. | |
| 6,242,561 B1 | 6/2001 | Mohwald et al. | |
| 6,294,245 B1 | 9/2001 | Roitman et al. | |
| 6,645,401 B2 | 11/2003 | Giles et al. | |
| 7,060,846 B2 | 6/2006 | Zahn et al. | |
| 7,071,289 B2 | 7/2006 | Sotzing | |
| 7,094,365 B2 | 8/2006 | Zahn et al. | |
| 7,118,692 B2 | 10/2006 | Nordquist et al. | |
| 7,241,904 B2 | 7/2007 | Zahn et al. | |
| 7,270,871 B2 | 9/2007 | Jiang et al. | |

(Continued)

FOREIGN PATENT DOCUMENTS

CA    2343444 A1    8/1999

(Continued)

OTHER PUBLICATIONS

Glenis et al., Polyfuran: A New Synthetic Approach and Electronic Properties, J. Am. Chem. Soc., 115, pp. 12519-12525 (1993).

(Continued)

*Primary Examiner*—Duc Truong
(74) *Attorney, Agent, or Firm*—Cantor Colburn, LLP

(57) ABSTRACT

Polymers and copolymers having units derived from unsubstituted or substituted thieno[3,4-b]furan are disclosed. Also provided are methods of making and using the same.

20 Claims, 1 Drawing Sheet

U.S. PATENT DOCUMENTS

| | | | |
|---|---|---|---|
| 2002/0011420 | A1 | 1/2002 | Roitman et al. |
| 2003/0077515 | A1 | 4/2003 | Chen et al. |
| 2004/0010115 | A1 | 1/2004 | Sotzing |
| 2004/0074779 | A1 | 4/2004 | Sotzing |
| 2005/0124784 | A1 | 6/2005 | Sotzing |
| 2005/0209419 | A1 | 9/2005 | Zahn et al. |
| 2006/0147616 | A1 | 7/2006 | Gaudiana et al. |
| 2006/0223977 | A1 | 10/2006 | Zahn et al. |

FOREIGN PATENT DOCUMENTS

| | | |
|---|---|---|
| EP | 0999242 B1 | 3/2003 |
| EP | 1510535 A1 | 2/2005 |
| WO | 9106887 | 5/1991 |

OTHER PUBLICATIONS

Gu, Synthesis and Characterization of Poly(2-decylthieno(3,4-b)thiophene), Chem Abstract, 125, 87896 (1996).

Neef et al., Synthesis and Electronic Properties of Poly(2-phenylthieno[3,4-b]thiophen), American Chemical Society, 128, 230943 (1998).

Neef et al., Synthesis and Electronic Properties of Poly(2-phenylthieno[3,4-b]thiophen), American Chemical Society, 131, 214964 (1999).

Pomerantz et al., A New Soluble Low-Bandgap Conducting Polymer, Elservier, 126, 293709 (1997).

Song Y. Hong et al., Understanding the Conformational Stability and Electronic Structures of Modified Polymers Based on Polythiopene, Micromolecules 1992, pp. 4652-4657.

International Search Report; International Application No. PCT/US2006/027038 ; International filing date Nov. 7, 2006; Date of mailing Nov. 22, 2006 (12 pages).

A. Bongini, et al., "New n-Dopable Thiophene Based Polymers"; Synthetic Metals, vol. 101 (1999) p. 13-14.

J. Eldo, et al. "New Low Band Gap Polymers: Control of Optical and Electronic Properties in near Infrared Absorbing Conjugated Polysquaraines"; Chemistry Materials, 2002, vol. 14 p. 410-418.

Gu Xiaomin, Part I: Synthesis and Characterization of Poly (2-Decylthieno[3,4-b]Thiophene), A Low Bandgap Conducting Polymer, Part II: Formation and Trapping of Methoxy-Carbonyl) Ketene (1995) (Ph.D dissertation, University of Texas at Arlington).

Arvind Kumar, et al. "Poly(thienol[3,4-b]furan). A New Low Band Gap Conjugated Polymer", Macromolecules, vol. 39, No. 8, Apr. 18, 2006 at pp. 2724-2725.

Youngkwan Lee, et al. "Synthesis and Characterization of a Soluble and Transparent Conducting Polymer, Poly (3,4-Ethylenedioxythiophene)" Mol. Cryst Liq. Cryst.; 1999, vol. 327 p. 237-240.

Byoungchul Lee, et al. "Aqueous phase Polymerization of Thieno[3,4-b] Thiophene" Polymer Preprints 2002, 43 (2) p. 568-569.

Kyunghoon Lee, et al. Poly(thieno[3,4-b] thiophene). A New Stable Low Band Gap Conducting Polymer; Macromolecules 200, vol. 34 at p. 5746-5747, 2001.

Kyunghoon Lee, et al. "Synthesis of poly(thieno[3,4-b]thiophene) and its electrochemical characterization", Polymer Preprints 2001, 42(2). at p. 413-414.

Kyunghoon Lee, et al. "Toward the Use of Poly(Thieno[3,4-b]Thiophene in Optoelectronic Devices," Polymer Preprints 2002, 43(2) at p. 610-611.

Kyunghoon Lee, et al. "Thieno[3,4-b]thiophene as a Novel Low Oxidation Crosslinking Agent," Polymeric Materials: Science and Engineering 2002, 86, at p. 195.

D.C. Loveday, et al. "Synthesis and Characterization of p- and n-Dopable Polymers. Electrochronic Properties of Poly 3-(p-trimethylammoniumphenyl)bthiophene," Synthetic Metals 84 (1997) at p. 245-246.

H. Meng, et al. "A Robust Low Band Gap Processable n-Type Conducting Polymer Based on Poly (isothianaphthene)," Macromolecules (2001) 34 at p. 1810-1816.

C.J. Neef, et al. "Synthesis and Electronic Properties of Poly(2-phenylthieno[3,4-b]thiophene): A New Low Band Gap Polymer," Chem. Mater. (1999), 11, at p. 1957-1958.

C.J. Neef, et al. "Synthesis and Electronic Properties of Poly(2-phenylthieno[3,4-b]thiophene)," Polym. Prepr. (1998), 39, at p. 147-148.

Martin Pomerantz, et al. "Poly(2-decylthieno[3,4-b]thiophene). A New Soluble Low-Bandgap Conducting Polymer," Synthetic Metals 84 (1997) 243-244.

Martin Pomerantz, et al. "Poly(2-decylthieno[3,4-b]thiophene-4,6-diyl). A New Low Band Gap Conducting Polymer," Macromolecules 34 (2001) 1817-1822.

Benjamin Reeves, et al. "Dual Cathodically and Anodically Coloring Electrochromic Polymer Based on a Spiro Bipropylenedioxythiophene [Poly(spiroBiProDOT)]**," Advanced Materials (2002), 14, No. 10 May 17 at p. 717-719.

J. Roncali, et al. "Enhancement of the Mean Conjugation Length in Conducting Polythiophenes," Synthetic Metals, 18 (1987) at p. 139-144.

Venkataramanan Seshadri, et al. "Ion Transport Behavior of Polymers and Copolymers containing Thieno[3,4- b]Thiophene," Polymer Preprints 2002, 43(2) at p. 584-585.

Gregory Sotzing, et al "Preparation and Characterization of Fully Conjugated Intrinsically Conducting Polymer Networks," Polymeric Materials: Science and Engineering (2002), 86, at p. 40-41.

Gregory Sotzing, et al "Intrinsically Conducting Polymers and Green Chemistry" Polymer Preprints (2002), 43(2), at p. 904.

Hans Wynberg, et al. "Thieno [3,4-b] Thiophene, The Third Thiophthene," Tetrahedron Letter (1967) No. 9, at p. 761-764.

Sotzing, et al "Poly(thienol[3,4-b]thiophene as a Low Band Gap Conducting Polymer and Electrochromic Material" Polymeric Materials: Science and Engineering 2001, 85 pp. 604-605.

John Moursounidis, et al., "The Synthesis of Theino '[3,4-b] Furan Using a Tandem Intramolecular-Reverse Diels-Alder Reaction Approach," Tetrahedron Letters, vol. 27, No. 26, pp. 3045-3048, 1986.

POLYMERS OF THIENO[3,4-B]FURAN, METHOD OF MAKING, AND USE THEREOF

CROSS-REFERENCE TO RELATED APPLICATIONS

This application claims the benefit of U.S. Patent Application Ser. No. 60/698,050, filed Jul. 11, 2005, which is incorporated by reference herein in its entirety.

BACKGROUND

Intrinsically conducting polymers are of wide utility in applications such as electronic packaging, organic light-emitting diodes (LEDs), electrochromic windows, volatile organic gas sensors, and the like. Intrinsically conducting polymers of particular interest possess a relatively low band gap (Eg), which refers to the energy difference between two electronic energy levels (the conduction band and the valence band). The band gap exhibited by a given polymer depends upon a variety of factors, including the structure of the monomer(s) used to form the polymer. For example, intrinsically conductive polymers formed from thiophene and substituted thiophene monomers are known. Poly(thiophene) has a band gap of 2.1 electron volts (eV), poly(2-decylthieno[3,4-b]thiophene) has a band gap of 0.92 eV, and poly(2-phenylthieno[3,4-b]thiophene) has a band gap of 0.85 eV. Intrinsically conductive polymers comprising polymerized units of thieno[2,3-b]thiophene and thieno[3,2-b]thiophene are also known.

Unfortunately, there are a number of drawbacks associated with many of the intrinsically conducting polymers currently available. The Eg of many polymers is undesirably high, and/or the polymers are not stable. Transparency is difficult to achieve, limiting their use in optical devices. Also of concern is the search for an efficient and inexpensive synthetic route to prepare intrinsically conducting polymers.

There remains a continuing need in the art, however, for intrinsically conducting polymers that exhibit useful band gaps for industrial applications and for the convenient synthesis of such polymers. Furthermore, there is a need for the adjustment of the conductivity and/or optoelectronic properties, such as the band gap and energy levels of the valence band and the conduction band, of such polymers to meet the needs of a particular application.

BRIEF SUMMARY OF THE INVENTION

Disclosed herein are polymers comprising units derived from thieno[3,4-b]furan.

In one embodiment, a polymer comprises units derived from thieno[3,4-b]furan according to the general structure (I), (II), or (III):

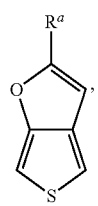
(I)

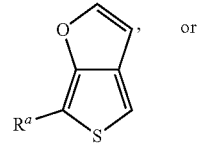
(II)

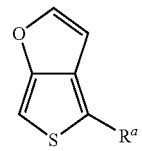
(III)

wherein $R^a$ is hydrogen, hydroxyl, $C_6$-$C_{12}$ aryl, $C_3$-$C_{10}$ cycloalkyl, $C_1$-$C_{12}$ alkyl including straight and branched chain alkyl, halogen, $C_1$-$C_{12}$ alkoxy, $C_1$-$C_{12}$ alkylthio, $C_1$-$C_{12}$ haloalkyl including straight and branched chain haloalkyl, $C_1$-$C_{12}$ haloalkoxy, $C_6$-$C_{12}$ haloaryl, pyridyl, cyano, thiocyanato, nitro, amino, $C_1$-$C_{12}$ alkylamino, $C_1$-$C_{12}$ aminoalkyl, acyl, sulfoxyl, sulfonyl, sulfonate, phosphonate, amido, or carbamoyl.

Also disclosed herein is a process comprising polymerizing a monomeric composition comprising thieno[3,4-b]furan according to the general structures (I), (II), or (III) above by chemical or electrochemical reaction to form a polymer.

DETAILED DESCRIPTION OF THE INVENTION

Figure 1:
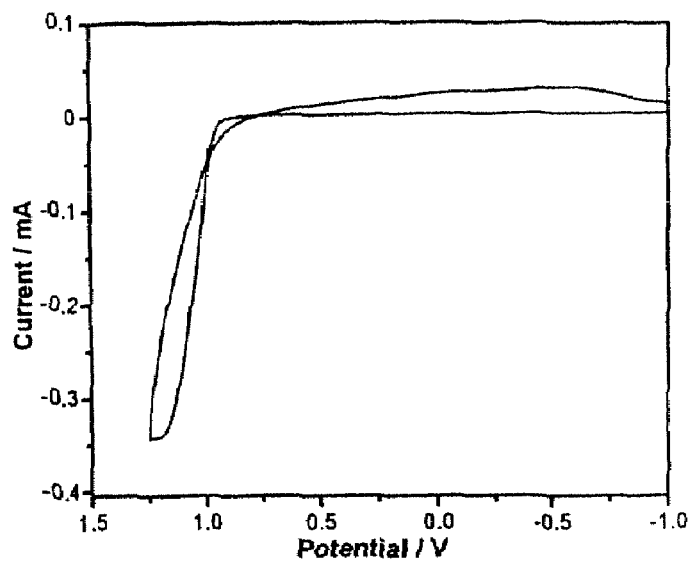
FIG. 1 illustrates the cyclovoltammetric oxidative polymerization of thieno[3,4-b]furan.

Disclosed herein are polymers and oligomers comprising units derived from units of thieno[3,4-b]furan (1), including homopolymers and copolymers.

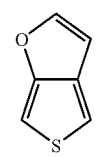
1

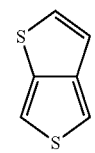
2

Intrinsically conducting polymers prepared from units derived from thieno[3,4-b]thiophene (2) are known. The homopolymer of thieno[3,4-b]thiophene has a band gap (Eg) of 0.85 electron volts (eV) and good electrochromic properties. There is no known method to prepare a corresponding polymer prepared from units of thieno[3,4-b]furan (1). The synthesis of polyfuran from furan monomers has been a particular challenge (See, J. Am. Chem. Soc. Vol. 115, pp.

12519-12525 (1993)). Indeed the electrochemical polymerization of furan requires a high voltage, resulting in irreversible oxidation of the resulting polymer (See, Jpn. J. Appl. Phys. Vol. 23, L663, (1984); J. Electroanal. Chem., Vol. 269, p. 263, (1990); and Eur. Polym. J. Vol. 21, p. 317 (1985)).

It has now been found that the homopolymer poly(thieno[3,4-b]furan) prepared from the thieno[3,4-b]furan monomer (1) exhibits a band gap value of 1.01 eV and also possesses good electrochromic properties. Furthermore, it is easier and more cost effective to prepare the thieno[3,4-b]furan monomer as compared to the thieno[3,4-b]thiophene monomer. Current synthetic processes to prepare the thieno[3,4-b]thiophene monomer requires a series of temperature changes and the use of the expensive starting material 3,4-dibromothiophene. Such convenience of synthesis and savings in cost allows for thieno[3,4-b]furan to be an attractive alternative to thieno[3,4-b]thiophene, especially when large quantities of the monomer are needed.

The thieno[3,4-b]furan monomer (1) has two alpha positions adjacent to the sulfur atom and one alpha position adjacent to the oxygen atom of the monomer. Reaction at the alpha positions of the monomer results in polymerized oligomers and polymers containing units of thieno[3,4-b]furan.

Unless otherwise indicated, poly(thieno[3,4-b]furan) includes homopolymers, copolymers and oligomers having at least three polymerized units of thieno[3,4-b]furan.

Also disclosed herein are polymers, including homopolymers and copolymers, and oligomers comprising units derived from thieno[3,4-b]furans of the general structures (I), (II), and (III):

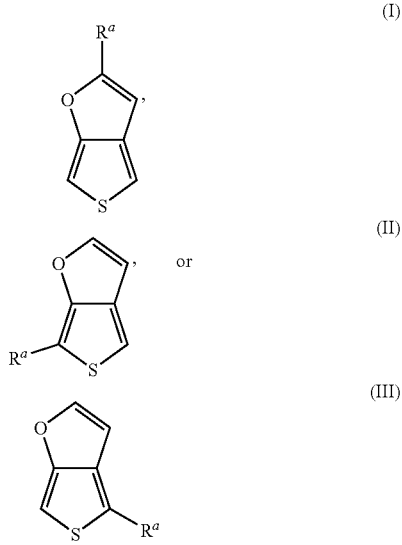

wherein $R^a$, can include, for example, hydrogen, hydroxyl, $C_6$-$C_{12}$ aryl, $C_3$-$C_{10}$ cycloalkyl, $C_1$-$C_{12}$ alkyl, halogen, $C_1$-$C_{12}$ alkoxy, $C_1$-$C_{12}$ alkylthio, $C_1$-$C_{12}$ haloalkyl, $C_1$-$C_{12}$ haloalkoxy, $C_6$-$C_{12}$ haloaryl, pyridyl, cyano, thiocyanato, nitro, amino, $C_1$-$C_{12}$ alkylamino, $C_1$-$C_{12}$ aminoalkyl, acyl, sulfoxyl, sulfonyl, sulfonate, phosphonate, amido, or carbamoyl.

The poly(thieno[3,4-b]furan) or substituted poly(thieno[3,4-b]furan) includes homopolymers of thieno[3,4-b]furan or substituted thieno[3,4-b]furan, respectively. Also provided herein are copolymers comprising units derived from thieno[3,4-b]furan and one or more substituted thieno[3,4-b]furans, or a copolymer of two or more substituted thieno[3,4-b]furans. Also provided herein are copolymers comprising units derived from thieno[3,4-b]furan and/or substituted thieno[3,4-b]furan and one or more additional monomers ("co-monomers") which provide a tailoring of the conductivity and/or optoelectronic properties of the resulting polymer. The co-monomers can include electroactive monomers and/or non-electroactive monomers. "Electroactive monomer" as used herein means a monomer or oligomer that is capable of copolymerization with thieno[3,4-b]furan, and that imparts or enhances the electrical/electronic properties of the resulting copolymer, including such properties as electrical conductivity, semiconductivity, electroluminescence, electrochromicity, photovoltaic properties, and/or the like. "Non-electroactive monomer" means a monomer that is capable of copolymerization and that either decreases or does not adversely affect the electrical/electronic properties of the resulting copolymer.

Examples of suitable electroactive monomers include those known in the art to exhibit electroactivity, including but not limited to thiophene, substituted thiophenes, thieno[3,4-b]thiophene, substituted thieno[3,4-b]thiophenes, dithieno[3,4-b:3',4'-d]thiophene, bithiophene, substituted bithiophenes, pyrrole, substituted pyrroles, phenylene, substituted phenylenes, naphthalene, substituted naphthalenes, biphenyl and terphenyl and their substituted versions, phenylene vinylene, substituted phenylene vinylenes, and the like.

Compounds are described using standard nomenclature. For example, any position not substituted by any indicated group is understood to have its valency filled by a bond as indicated, or a hydrogen atom. A dash ("-") that is not between two letters or symbols is used to indicate a point of attachment for a substituent. For example, "—CHO" is attached through carbon of the carbonyl group.

Unless otherwise indicated, the term "substituted" as used herein means replacement of one or more hydrogens with one or more substituents that do not significantly adversely affect polymerization and/or use of the polymer. Suitable substituents include, for example, hydroxyl, $C_6$-$C_{12}$ aryl, $C_3$-$C_{10}$ cycloalkyl, $C_1$-$C_{12}$ alkyl, halogen, $C_1$-$C_{12}$ alkoxy, $C_1$-$C_{12}$ alkylthio, $C_1$-$C_{12}$ haloalkyl, $C_6$-$C_{12}$ haloaryl, pyridyl, cyano, thiocyanato, nitro, amino, $C_1$-$C_{12}$ alkylamino, $C_1$-$C_{12}$ aminoalkyl, acyl, sulfoxyl, sulfonyl, amido, and/or carbamoyl.

As used herein, "alkyl" includes both branched and straight chain saturated aliphatic hydrocarbon groups, having the specified number of carbon atoms, generally from 1 to about 12 carbon atoms. Examples of alkyl include, but are not limited to, methyl, ethyl, n-propyl, isopropyl, n-butyl, 3-methylbutyl, t-butyl, n-pentyl, and sec-pentyl. Alkyl groups described herein typically have from 1 to about 12 carbons atoms. Specific alkyl groups include lower alkyl groups, those alkyl groups having from 1 to about 8 carbon atoms, from 1 to about 6 carbon atoms, or from 1 to about 4 carbons atoms.

As used herein "haloalkyl" indicates both branched and straight-chain alkyl groups having the specified number of carbon atoms, substituted with 1 or more halogen atoms, generally up to the maximum allowable number of halogen atoms ("perhalogenated"). Examples of haloalkyl include, but are not limited to, trifluoromethyl, difluoromethyl, 2-fluoroethyl, and penta-fluoroethyl.

As used herein, "alkoxy" includes an alkyl group as defined above with the indicated number of carbon atoms attached through an oxygen bridge (—O—). Examples of alkoxy include, but are not limited to, methoxy, ethoxy, n-propoxy, i-propoxy, n-butoxy, 2-butoxy, t-butoxy, n-pentoxy, 2-pentoxy, 3-pentoxy, isopentoxy, neopentoxy, n-hexoxy, 2-hexoxy, 3-hexoxy, and 3-methylpentoxy.

"Haloalkoxy" indicates a haloalkyl group as defined above attached through an oxygen bridge.

As used herein, "cycloalkyl" indicates a monocyclic or multicyclic saturated or unsaturated hydrocarbon ring group, having the specified number of carbon atoms, usually from 3 to about 10 ring carbon atoms. Monocyclic cycloalkyl groups typically have from 3 to about 8 carbon ring atoms or from 3 to about 7 carbon ring atoms. Multicyclic cycloalkyl groups may have 2 or 3 fused cycloalkyl rings or contain bridged or caged cycloalkyl groups. Examples of cycloalkyl groups include cyclopropyl, cyclobutyl, cyclopentyl, or cyclohexyl as well as bridged or caged saturated ring groups such as norbornane or adamantane.

As used herein, the term "aryl" indicates aromatic groups containing only carbon in the aromatic ring or rings. Such aromatic groups may be further substituted with carbon or non-carbon atoms or groups. Typical aryl groups contain 1 or 2 separate, fused, or pendant rings and from 6 to about 12 ring atoms, without heteroatoms as ring members. Where indicated aryl groups may be substituted. Such substitution may include fusion to a 5 to 7-membered saturated cyclic group that optionally contains 1 or 2 heteroatoms independently chosen from N, O, and S, to form, for example, a 3,4-methylenedioxy-phenyl group. Aryl groups include, for example, phenyl, naphthyl, including 1-naphthyl and 2-naphthyl, and bi-phenyl.

As used herein, "halo" or "halogen" refers to fluoro, chloro, bromo, or iodo.

Suitable co-monomers include thieno[3,4-b]thiophene or substituted thieno[3,4-b]thiophenes represented by the general structures (IX), (X), and (XI):

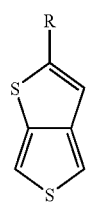

(IX)

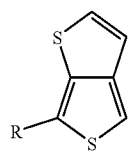

(X)

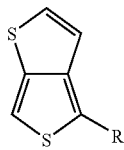

(XI)

wherein R is hydroxyl, $C_6$-$C_{12}$ aryl, $C_3$-$C_{10}$ cycloalkyl, $C_1$-$C_{12}$ alkyl, halogen, $C_1$-$C_{12}$ alkoxy, $C_1$-$C_{12}$ alkylthio, $C_1$-$C_{12}$ haloalkyl, $C_6$-$C_{12}$ haloaryl, pyridyl, cyano, thiocyanato, nitro, amino, $C_1$-$C_{12}$ alkylamino, $C_1$-$C_{12}$ aminoalkyl, acyl, sulfonyl, sulfonate, phosphonate, amido, or carbamoyl, carboxylic acid, $C_1$-$C_{12}$ alkyl carboxylic acid ester, or sulfonic acid (—$SO_3H$).

Suitable co-monomers also include substituted thiophenes, furans, pyrroles, and their derivatives having the general structure (XII):

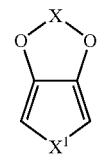

(XII)

wherein $X^1$ is S, O, or N—$R^5$, wherein $R^5$ is hydrogen or $C_1$-$C_{12}$ alkyl; X is $C_1$-$C_4$ alkylene or substituted $C_1$-$C_4$ alkylene. In one embodiment, X is $C_1$-$C_{12}$ alkyl- or $C_6$-$C_{12}$ phenyl-substituted ethylene, or a 1,2-cyclohexylene. Optionally, the alkyl or phenyl groups can be further substituted as described above. An exemplary substituted thiophene includes 3,4-ethylenedioxythiophene.

Other suitable co-monomers include un-substituted and substituted thiophenes, furans, pyrroles and their derivatives having the general structure (XIII):

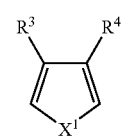

(XIII)

wherein $X^1$ is as previously defined; $R^3$ and $R^4$ are the same or different and are hydrogen, hydroxyl, $C_6$-$C_{12}$ aryl, $C_3$-$C_{10}$ cycloalkyl, $C_1$-$C_{12}$ alkyl, $C_1$-$C_{12}$ alkoxy, $C_1$-$C_{12}$ alkylthio, halogen, $C_1$-$C_{12}$ haloalkyl, $C_1$-$C_{12}$ haloalkoxy, $C_6$-$C_{12}$ haloaryl, —$C_1$-$C_6$ alkyl-O—$C_1$-$C_6$ alkyl, or —$C_1$-$C_6$ alkyl-O—$C_6$-$C_{12}$ aryl.

Still other suitable co-monomers include oxazoles, thiazoles, and their derivatives having the general structure (XIV):

(XIV)

wherein $Q^1$ is S or O.

Other suitable co-monomers include, for example, isathianaphthene, pyridothiophene, pyrizinothiophene, and derivatives according to the general structure (XV):

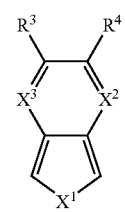

(XV)

wherein $X^1$, $R^3$, and $R^4$ are as previously defined; wherein $X^2$ and $X^3$ are the same or different and are CH or N.

Other suitable co-monomers include 3,4-ethylenedioxypyrrole, 3,4-ethylenedioxythiophene, 3,4-ethylenedithiathiophene, 3,4-ethylenedithiapyrrole, 3,4-ethylenedioxyfuran, 3,4-ethylenedithiafuran, and their derivatives having the general structure (XVI):

(XVI)

wherein $X^1$, $Q^1$, $R^3$, and $R^4$ are as previously defined; and wherein each occurrence of $Q^1$, $R^3$, and $R^4$ may be the same or different.

Yet other suitable co-monomers include thionapthenes, benzofurans, indoles, and their derivatives as shown in the general structure (XVII):

(XVII)

wherein $X^1$ is as previously defined.

Further examples of suitable co-monomers include thienofurans, thienopyrroles, furanylpyrroles, furanylfurans, pyrrolylpyrroles, and their derivatives as shown in the general structure (XVIII):

(XVIII)

wherein $X^1$, $R^3$, and $R^4$ are as previously defined; and wherein each occurrence of $X^1$ may be the same or different.

Still other suitable co-monomers include dithienothiophenes, difuranylthiophenes, dipyrrolylthiophenes, dithienofurans, dipyrrolylfurans, dipyrrolylpyrroles, and their derivatives as shown in structure (XIX):

(XIX)

wherein $X^1$ is as previously defined; wherein each occurrence of $X^1$ may be the same or different; wherein $X^4$ is $C(R^3)_2$, S, O, or $N-R^5$, wherein $R^3$ and $R^5$ are as previously defined.

Other suitable co-monomers include bithiophenes, bifurans, bipyrroles, and their derivatives as shown in the general structure (XX):

(XX)

wherein $X^1$ and $R^3$ are as previously defined; and wherein each occurrence of $X^1$ or $R^3$ may be the same or different.

More suitable co-monomers include terthiophenes, terfurans, terpyrroles, and their derivatives as shown in the general structure (XXI):

(XXI)

wherein $X^1$ and $R^3$ are as previously defined; and wherein each occurrence of $X^1$ or $R^3$ may be the same or different.

Other suitable co-monomers include dithienylcyclopentenones, difuranylcyclopentenones, dipyrrolylcyclopentenones, and their derivatives as shown in the general structure (XXII):

(XXII)

wherein $X^1$ is as previously defined; and wherein each occurrence of $X^1$ may be the same or different; and E is O or $C(R^7)_2$, wherein each occurrence of $R^7$ is an electron withdrawing group.

More suitable co-monomers include heteroaryl monomers having the general structure (XXIII):

(XXIII)

wherein $X^1$, $Q^1$, and $R^3$ are as previously defined; and wherein each occurrence of $X^1$, $Q^1$, or $R^3$ may be the same or different.

More suitable co-monomers include dithienovinylenes, difuranylvinylenes, dipyrrolylvinylenes, and their derivatives having the general structure (XXIV):

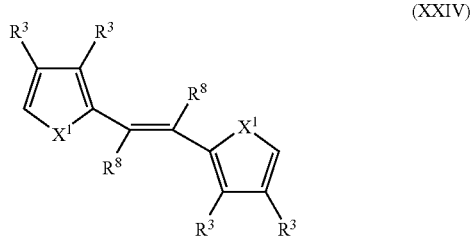

(XXIV)

wherein $X^1$ and $R^3$ are as previously defined; and wherein each occurrence of $X^1$ or $R^3$ may be the same or different; and each occurrence of $R^8$ is hydrogen, $C_1$-$C_6$ alkyl, or cyano.

More suitable co-monomers include 1,2-trans(3,4-ethylenedioxythienyl)vinylenes, 1,2-trans(3,4-ethylenedioxyfuranyl)vinylenes, 1,2-trans(3,4-ethylenedioxypyrrolyl)vinylenes, and their derivatives having the general structure (XXV):

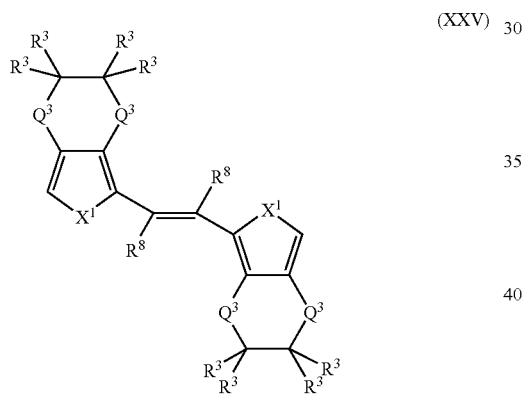

(XXV)

wherein $X^1$, $R^3$, and $R^8$ are as previously defined; wherein each occurrence of $X^1$, $R^3$, or $R^8$ may be the same or different; and wherein each occurrence of $Q^3$ is independently $CH_2$, S, or O.

More examples of suitable co-monomers include bis-thienylarylenes, bis-furanylarylenes, bis-pyrrolylarylenes, and their derivatives having the general structure (XXVI):

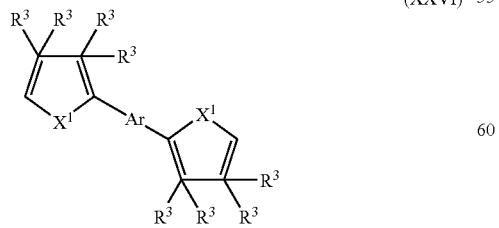

(XXVI)

wherein $X^1$ and $R^3$ are as previously defined; wherein each occurrence of $X^1$ or $R^3$ may be the same or different; and wherein Ar is a furan, pyrrole, N-substituted pyrrole, phenyl, biphenyl, thiophene, fluorene, or 9-alkyl-9H-carbazole.

Other suitable co-monomers include compounds having the general structure (XXVII):

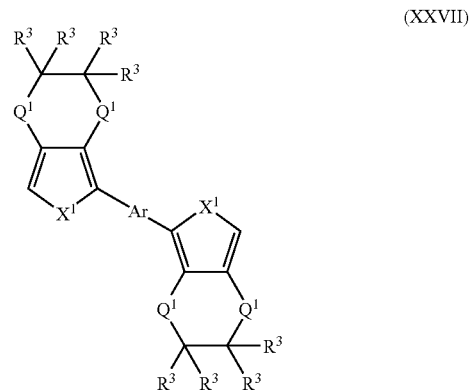

(XXVII)

wherein $X^1$, $Q^1$, $R^3$, and Ar are as previously defined; and wherein each occurrence of $X^1$, $Q^1$, or $R^3$ may be the same or different.

Other suitable co-monomers include compounds having the general structure (XXVIII):

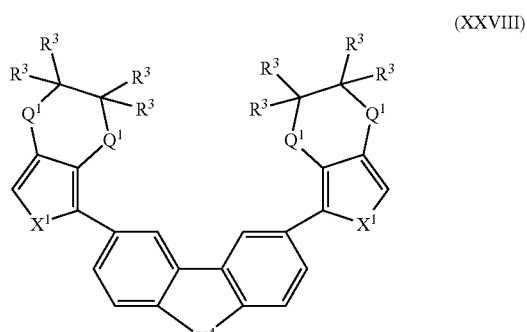

(XXVIII)

wherein $X^1$, $X^4$, $Q^1$, and $R^3$ are as previously defined; and wherein each occurrence of $X^1$, $Q^1$, or $R^3$ may be the same or different.

Other suitable co-monomers include compounds having the general structure (XXIX):

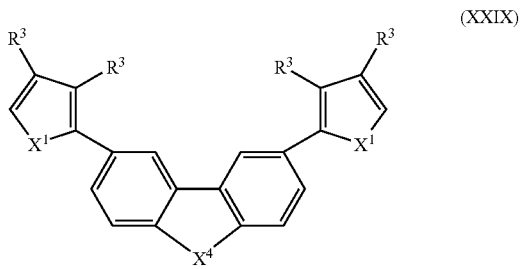

(XXIX)

wherein $X^1$, $X^4$, and $R^3$ are as previously defined; and wherein each occurrence of $X^1$ or $R^3$ may be the same or different.

Other suitable co-monomers include compounds having the general structure (XXX):

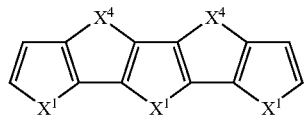

(XXX)

wherein $X^1$ and $X^4$ are as previously defined; and wherein each occurrence of $X^1$ or $X^4$ may be the same or different.

Other suitable co-monomers include compounds having the general structure (XXXI):

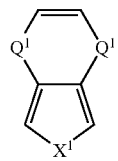

(XXXI)

wherein $X^1$ and $Q^1$ are as previously defined; and wherein each occurrence of $Q^1$ may be the same or different.

Other suitable co-monomers include compounds having the general structure (XXXII):

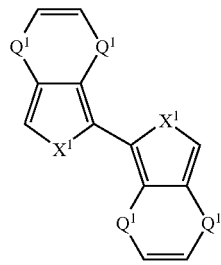

(XXXII)

wherein $X^1$ and $Q^1$ are as previously defined; and wherein each occurrence of $X^1$ or $Q^1$ may be the same or different.

Other suitable co-monomers include compounds having the general structure (XXXIII):

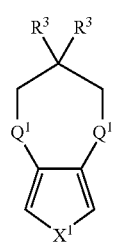

(XXXIII)

wherein $X^1$, $R^3$, and $Q^1$ are as previously defined; and wherein each occurrence of $R^3$ or $Q^1$ may be the same or different.

Other suitable co-monomers include compounds having the general structure (XXXIV):

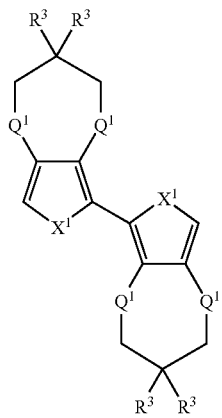

(XXXIV)

wherein $X^1$, $R^3$, and $Q^1$ are as previously defined; and wherein each occurrence of $X^1$, $R^3$, or $Q^1$ may be the same or different.

Other suitable co-monomers include compounds having the general structure (XXXV):

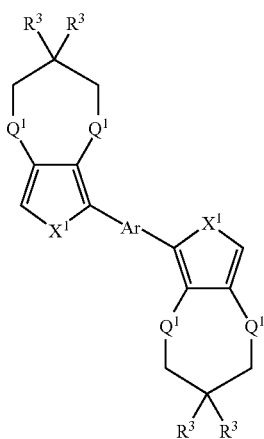

(XXXV)

wherein $X^1$, $R^3$, $Q^1$, and Ar are as previously defined; and wherein each occurrence of $X^1$, $R^3$, or $Q^1$ may be the same or different.

Other suitable co-monomers include compounds having the general structure (XXXVI):

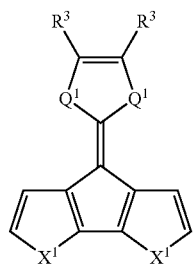

(XXXVI)

wherein $X^1$, $R^3$, and $Q^1$ are as previously defined; and wherein each occurrence of $X^1$, $R^3$, or $Q^1$ may be the same or different.

Yet other suitable co-monomers include compounds having the general structure (XXXVII):

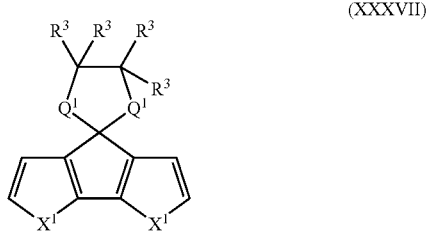

(XXXVII)

wherein $X^1$, $R^3$, and $Q^1$ are as previously defined; and wherein each occurrence of $X^1$, $R^3$, or $Q^1$ may be the same or different.

Another type of polymer comprises thieno[3,4-b]furan units and/or substituted thieno[3,4-b]furan units wherein the end units are substituted with reactive functional groups. Such polymers or oligomers may be incorporated into block copolymers directly by reaction between the functional groups or with other monomers or oligomers to form copolymeric compositions. Alternatively, the endgroups may be further derivatized with difunctional reactants known in the art (for example, hydroxyl endgroups could be coupled with diisocyanates or molecules containing at least two acid chlorides). The oligomers thus derivatized may then be coupled with each other, or other co-reactive monomers or polymers. Use of such derivatized oligomers in the formation of polymers provides a convenient method for controlling the conjugation length of the resulting polymer. The conjugation length in the oligomeric structure can be varied to achieve desired properties for a variety of applications.

In one embodiment, the copolymer comprises 1 to about 99 percent thieno[3,4-b]furan units, specifically about 20 to about 90 percent, more specifically about 30 to about 80 percent, and yet more specifically about 40 to about 70 percent thieno[3,4-b]furan units present in the copolymer.

In another embodiment, the copolymer comprises 1 to about 99 percent substituted thieno[3,4-b]furan units, specifically about 20 to about 90 percent, more specifically about 30 to about 80 percent, and yet more specifically about 40 to about 70 percent substituted thieno[3,4-b]furan units present in the copolymer.

The polymers derived from units of thieno[3,4-b]furan and/or substituted thieno[3,4-b]furan can be prepared via an electrochemical process wherein thieno[3,4-b]furan and optional co-monomer is polymerized in an electrochemical cell using a three electrode configuration. An exemplary three electrode configuration comprises a button working electrode such as platinum, gold or vitreous carbon button working electrodes, a platinum flag counter electrode, and an Ag/Ag+ non-aqueous reference electrode. Exemplary suitable electrolytes include tetrabutylammonium perchlorate/acetonitrile, lithium triflate/acetonitrile and tetrabutylammonium hexafluorophosphate/acetonitrile, and the like.

Thieno[3,4-b]furan undergoes electrochemical oxidation at a peak volt of 1.2 volt to provide the homopolymer, poly(thieno[3,4-b]furan) on the surface of the working electrode. Upon completion of the polymerization, the polymer can be removed from the working electrode by washing with a solvent such as acetonitrile.

Conventional electrolytic cells can be utilized to practice the electrochemical process for making the polymers. In one embodiment, the working electrode is a vitreous carbon electrode and the electrolyte is tetrabutylammonium perchlorate/acetonitrile.

Alternatively, the polymers derived from units of thieno[3,4-b]furan and/or substituted thieno[3,4-b]furan can be prepared via a chemical process, specifically an aqueous phase polymerization method wherein thieno[3,4-b]furan, a polyanion and an oxidant are reacted in the presence of water under reaction conditions sufficient to form poly(thieno[3,4-b]furan). Alternatively, the polymers derived from units of thieno[3,4-b]furan can be prepared via a chemical process in the presence of organic solvents, including halogenated solvents such as methylene chloride and chloroform, and non-halogenated solvents such as toluene, dimethylformamide, dimethylacetamide, dimethylsulfoxide, acetonitrile, nitromethane, nitrobenzene, and the like.

Typical reaction conditions include temperatures ranging from 0° C. to about 50° C. The polymerization is continued for a period of time until the reaction in completed to effect the desired degree of polymerization. The degree of polymerization can vary depending upon the end use application as is readily determined by one of ordinary skill in the art without undue experimentation. The polymerization time may range from a few minutes up to about 48 hours and depends on a number of factors including the size of the reactor utilized in the polymerization, the polymerization temperature, and the oxidant utilized in the polymerization process.

The amount of polyanion and oxidant to be employed in the aqueous polymerization method may broadly vary and can be determined for any given polymerization without undue experimentation. For example the weight ratio of thieno[3,4-b]furan monomer to a desired polyanion typically ranges from about 0.001 to about 10, specifically about 0.05 to about 1.0. The weight ratio of thieno[3,4-b]furan monomer to a desired oxidant typically ranges from about 0.01 to about 10, specifically about 0.1 to about 2.0.

Exemplary suitable polyanions include an anion of a polycarboxylic acid, such as polyacrylic acid, polymethacrylic acid, perfluorosulfonic acid polymers commercially available from, for example, E.I. DuPont de Nemours & Co. under the trade name NAFION, polymaleic acid, and polymeric sulfonic acids, such as polystyrene sulfonic acid and polyvinyl sulfonic acid. The polycarboxylic and polysulfonic acids may also be copolymers of vinyl carboxylic and vinyl sulfonic acids with other monomers, such as acrylates and styrene. The molecular weight of the acids supplying the polyanions can be in the range from about 1,000 to about 500,000, specifically from about 2000 to about 500,000, and more specifically about 70,000. The acids from which the polyanions are derived are commercially available or may be produced by known methods.

Suitable oxidants include iron (III) salts, such as $FeCl_3$, $Fe(ClO_4)_3$ and the iron (III) salts of organic acids and inorganic acids containing organic residues, $H_2O_2$, $K_2Cr_2O_7$, alkali or ammonium persulfates, alkali perborates, potassium permanganate and copper salts such as copper tetrafluoroborate. In addition, iodine, air, and oxygen may advantageously be used as oxidants.

Examples of iron (III) salts of organic acids are the Fe(III) salts of $C_1$-$C_{30}$ alkyl sulfonic acids, such as methane or dodecane sulfonic acid; aliphatic $C_1$-$C_{20}$ carboxylic acids, such as 2-ethylhexylcarboxylic acid, aliphatic perfluorocarboxylic acids, such as trifluoroacetic acid and perfluorooctanoic acid; aliphatic dicarboxylic acids, such as oxalic acid, and, aromatic, optionally $C_1$-$C_{20}$-alkyl-substituted sulfonic acids, such as benzenesulfonic acid, p-toluene-sulfonic acid, and dodecyl benzenesulfonic acid and mixtures of the aforementioned Fe(III) salts of organic acids. Examples of iron (III) salts of inorganic acids containing organic residues are the iron (III) salts of sulfuric acid semiesters of $C_1$-$C_{20}$ alkanols, for example the Fe(III) salt of lauryl sulfate.

The ratio of oxidant to thieno[3,4-b furan] monomer and optional additional monomer can be about 1:1 to about 4:1.

The electrochemical method and chemical polymerization method may be used to conduct a homopolymerization or a copolymerization of the thieno[3,4-b]furan or substituted thieno[3,4-b]furan, and optionally with one or more co-monomers as described above.

The homopolymers and copolymers described herein may be used in the form of dispersions comprising the polymer and an organic or aqueous liquid carrier. It is to be understood that the term "dispersion" as used herein is inclusive of compositions wherein none or a portion of the polymer is fully dissolved in the liquid. Specifically, the polymers of the dispersion are in the form of small particles that are storage stable, i.e., remain in substantially the same particulate form for at least about 24 hours, more specifically at least about 48 hours, even more specifically at least about one week, and yet more specifically at least about one month. In one embodiment, the liquid carrier is the same as the solvent in which the polymers are manufactured, preferably water and/or one or more water-miscible organic solvents. Of course, additional solvent may be used to dilute the dispersion if desired. The amount of the polymer in the dispersion may vary from about 1 to about 99 percent by weight depending upon a variety of factors, for example, the nature of the solvent, the nature of the polymer, the molecular weight of the polymer, and the end-use application, and is readily determined by one of ordinary skill in the art without undue experimentation.

Dispersions or solutions containing the thieno[3,4-b]furan polymers can be formed into films by applying the dispersions or solutions to a substrate via conventional processes including ink jet printing, screen printing, roll to roll printing processes, reel to reel processing, spin coating, meniscus and dip coating, spray coating, brush coating, doctor blade application, curtain casting, drop casting, and the like, to form a layer. Suitable substrates are solid materials (flexible or rigid) suitable for deposition of the polymeric compositions, and may be, for example, glass, an organic polymer such as a plastic, silicon, a mineral, a semiconducting material, a ceramic, a metal, and the like, as well as a combination comprising at least one of the foregoing materials. The substrate may be inherently conductive.

The liquid may be removed from the layer of the dispersion or solution by conventional techniques to form a film. Removal of the liquid may be effected at room temperature or other temperature that does not adversely affect the properties of the resulting film. However, to obtain higher processing speeds, the film can be dried at elevated temperatures.

The electrical conductivity of the films can be readily modified, if necessary, to meet the requirements of a desired application by doping with conventional acidic dopants (p-dopants) or basic dopants (n-dopants) known in the art. Suitable p-dopants include mineral acids such as HCl, $HNO_3$, $H_2SO_4$, $H_3PO_4$, HBr, and HI; organic sulfonic acids such as dodecyl benzene sulfonic acid, lauryl sulfonic acid, camphor sulfonic acid, organic acid dyes, methane sulfonic acid, and toluene sulfonic acid; polymeric sulfonic acids such as polystyrene sulfonic acid) and copolymers of styrene sulfonic acids; carboxylic acids such as adipic acid, azelaic acid, and oxalic acid; and polycarboxylic acids such as poly(acrylic acid), poly(maleic acid), poly(methacrylic acid), and copolymers formed from acrylic acid, maleic acid, and/or methacrylic acid. Conventional mixed dopants comprising one or more of the foregoing, such as a mixture of a mineral acid and an organic acid, can also be used to impart the desired electroactive character to the films. Suitable basic dopants include, but are not limited to Na, K, Li, and Ca. Other suitable dopants include $I_2$, $PF_6$, $SbF_6$, and $FeCl_3$. In some instances the oxidant and the dopant may be the same.

Admixtures of the polymer with other electroactive materials such as laser dyes, other electroactive polymers, hole transport or electron transport materials, including electroactive organometallic compounds, are also contemplated herein. Such materials can be added to the polymer before or after formation of the solution or dispersion. Additives such as ethylene glycol, diethylene glycol, mannitol, propylene 1,3-glycol, butane 1,4-glycol, N-methylpyrrolidone, sorbitol, glycerol, propylene carbonate, and other appropriate high boiling organics may be added to dispersions of the polymeric compositions to improve conductivity.

Additional additives may also be used, and include conductive fillers such as particulate copper, silver, nickel, aluminum, carbon black (carbon nanotubes, buckminister fullerene), and the like; non-conductive fillers such as talc, mica, wollastonite, silica, clay, dyes, pigments (zeolites), and the like, to promote specific properties such as increased modulus, surface hardness, surface color and the like; antioxidants; UV stabilizers; viscosity modifiers; and surfactants such as acetylenic diols, surfactants typically being added to control stability, surface tension, and surface wettability.

The thieno[3,4-b]furan polymers disclosed herein can be processed by conventional methods to provide uniform, thin films that possess utility in numerous applications. Films and materials comprising the above-described polymers can be utilized in a variety of applications, including antistatic coatings, electrically conductive coatings, electrochromic devices, photovoltaic devices, light emitting diodes for display applications, near infrared light emitting diodes, flat panel displays, flexible displays, photoimageable circuits, printable circuits, thin film transistor devices, batteries, electrical switches, capacitor coatings, corrosion resistant coatings, electromagnetic shielding, sensors, biosensors, dimmable mirrors, type III supercapacitors, LED lighting, and the like. The electrical conductivity of the polymers can be readily modified, if necessary, to meet the requirements of any of the previously mentioned applications by doping the polymers with conventional acidic dopants (p-dopants) and basic dopants (n-dopants) known in the art.

The above-described polymers are particularly well suited for use in fabricating certain components of light emitting diodes (LEDs). LEDs typically comprise a substrate, and indium tin oxide (ITO) anode, a hole injection layer, a hole transport layer, a light emitting layer, an electron transport layer, an electron injection layer, and a cathode. The p-doped polymers are particularly suited for replacing the indium tin oxide anode of the LED, and/or as the hole injection layer of the LED. Undoped polymers described herein can be utilized in the hole transport layer, the light emitting layer and/or the electron transport layer of the LED.

The above-described polymers are also particularly well suited for use in fabricating certain components of photovoltaic devices, which are constructed similarly to LEDs. Instead of electrical voltage placed across the device to produce light for the LED device, the input of light (e.g. sunlight) produces a voltage difference across the device to produce an electric current. The devices comprise a light harvesting organic or polymer intermediate layer, with hole transport/electron transport layers optionally placed between the anode and cathode. The polymers can be utilized as the anode and hole injection layers (doped) or in the light harvesting layers (undoped).

The polymers comprising units of thieno[3,4-b]furan and optionally other co-monomers can be synthetically modified ("post-polymerization modification") to provide further optimization of optoelectronic properties, conductivity, and/or solvent solubility unavailable from a polymer obtained directly from a polymerization process. Exemplary methods of a post-polymerization modification include performing electrophilic substitution reactions at the available sites of the thieno[3,4-b]furan units and other co-monomer units which can undergo electrophilic substitution. Suitable electrophilic substitution reactions include, for example, sulfonation, nitration, alkylation, acylation, halogenation, and the like. Such processes performed on poly(thieno[3,4-b]thiophene)s are disclosed in U.S. Published Application 2005-0124784 A1 incorporated herein by reference.

The following illustrative examples are provided to further describe how to make and use the polymers and are not intended to limit the scope of the claimed invention.

EXAMPLES

Thieno[3,4-b]furan monomer was prepared according to the procedure provided in Tetrahedron Letters Vol. 27, pp. 3045-3048 (1986) and characterized by infrared spectroscopy, nuclear magnetic resonance spectroscopy, and gas chromatography-mass spectroscopy.

Poly(thieno[3,4-b]furan) homopolymer was prepared via electrochemical polymerization. A ten mM solution of thieno[3,4-b]furan monomer was prepared by dissolving the required amount of monomer in 0.1 M tetrabutylammonium perchlorate/acetonitrile (TBAP/ACN) solution. Electropolymerization was performed using a three electrode cell containing a platinum flag counter electrode (1 cm²), a platinum button working electrode, and Ag/Ag+ non-aqueous reference electrode (0.473 volt versus standard hydrogen electrode as determined by calibration with a ferrocene solution). The scan rate was 100 millivolt per second (mV/s). FIG. 1 illustrates the cyclovoltammetric oxidative polymerization of thieno[3,4-b]furan monomer. As shown, the monomer oxidation onset is at 0.92 volt and a peak at 1.2 volt. The onset oxidation potential is comparable to thieno[3,4-b]thiophene, but exhibits a peak potential of 0.1 volt higher than that of thieno[3,4-b]thiophene. It has been found that electropolymerization of thieno[3,4-b]furan on scanning the potential from −1.0 to 1.25 V versus Ag/Ag+ results in a homopolymer having a low band gap value of 1.01 eV.

Figure 2:
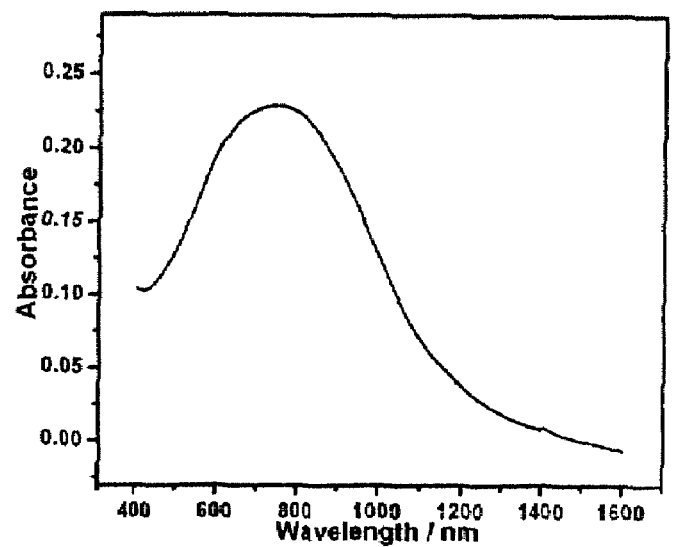
FIG. 2 illustrates a UV-vis-NIR spectrum of a 0.1 μm thick poly(thieno[3,4-b]furan) film on ITO glass, the film was electrochemically reduced.

The spectroelectrochemical properties of the poly(thieno[3,4-b]furan) homopolymer were studied. Indium doped tin oxide (ITO) coated glass (Rs=15-25Ω, unpolished float glass from Delta Technologies, Limited) was used as the substrate to study the spectroelectrochemical properties of poly(thieno[3,4-b]furan) homopolymer. A 10 mM/0.1M TBAP/ACN solution was used to prepare about a 0.1 μm polymer film as measured using a profilometer on an ITO coated glass at 1.15 V. The polymer film was reduced chemically by dipping it into a 0.2 volume percent hydrazine solution. An ultraviolet-visible-near infrared (UV-vis-NIR) spectrum of the polymer in the reduced state is provided in FIG. 2. As illustrated, the onset for the valence to conduction band occurs at 1.03 eV (1200 nm) with a peak at 1.72 eV (720 nm).

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising", "having", "including", and "containing" are to be construed as open-ended terms (i.e., meaning "including, but not limited to") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All ranges disclosed herein are inclusive and combinable.

The essential characteristics of the present invention are described completely in the foregoing disclosure. One skilled in the art can understand the invention and make various modifications without departing from the basic spirit of the invention, and without deviating from the scope and equivalents of the claims, which follow. Moreover, any combination of the above-described elements in all possible variations thereof is encompassed by the invention unless otherwise indicated herein or otherwise clearly contradicted by context.

What is claimed is:

1. A polymer, comprising:
   units derived from thieno[3,4-b]furan according to the structures (I), (II), or (III):

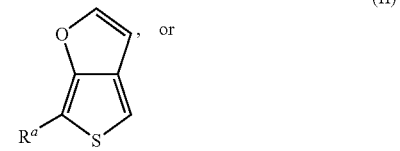

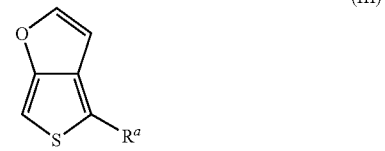

wherein $R^a$ is hydrogen, hydroxyl, $C_6$-$C_{12}$ aryl, $C_3$-$C_{10}$ cycloalkyl, $C_1$-$C_{12}$ alkyl, halogen, $C_1$-$C_{12}$ alkoxy, $C_1$-$C_{12}$ alkylthio, $C_1$-$C_{12}$ haloalkyl, $C_1$-$C_{12}$ haloalkoxy, $C_6$-$C_{12}$ haloaryl, pyridyl, cyano, thiocyanato, nitro, amino, $C_1$-$C_{12}$ alkylamino, $C_1$-$C_{12}$ aminoalkyl, acyl, sulfoxyl, sulfonyl, sulfonate, phosphonate, amido, or carbamoyl.

2. The polymer of claim 1, wherein the polymer is a homopolymer.

3. The polymer of claim 2, wherein $R^a$ is hydrogen or $C_1$-$C_6$ alkyl.

4. The polymer of claim 1, wherein the polymer is a copolymer comprising, in addition to the units derived from thieno[3,4-b]furan, units derived from a co-monomer reactive with the thieno[3,4-b]furan.

5. The polymer of claim 4, wherein the co-monomer is a substituted thieno[3,4-b]furan, thiophene, substituted thiophene, thieno[3,4-b]thiophene, substituted thienothiophene, dithieno[3,4-b:3',4'-d]thiophene, bithiophene, pyrrole, substituted pyrrole, phenylene, substituted phenylene, naphthalene, substituted naphthalene, biphenyl, substituted biphenyl, terphenyl, substituted terphenyl, phenylene vinylene, substituted phenylene vinylene, or a combination comprising at least one of the foregoing co-monomers, wherein the substituents are one or more of hydroxyl, $C_6$-$C_{12}$ aryl, $C_3$-$C_{10}$ cycloalkyl, $C_1$-$C_{12}$ alkyl, halogen, $C_1$-$C_{12}$ alkoxy, $C_1$-$C_{12}$ alkylthio, $C_1$-$C_{12}$ haloalkyl, $C_6$-$C_{12}$ haloaryl, pyridyl, cyano, thiocyanato, nitro, amino, $C_1$-$C_{12}$ alkylamino, $C_1$-$C_{12}$ aminoalkyl, acyl, sulfoxyl, sulfonyl, sulfonate, phosphonate, amido, carbamoyl, or a combination comprising at least one of the foregoing substituents.

6. The polymer of claim 4, wherein the co-monomer has the structure (IX), (X), or (XI):

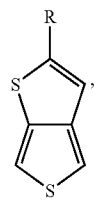

(IX)

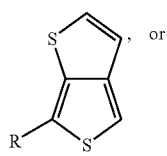

(X), or

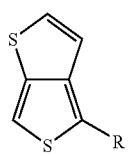

(XI)

wherein R is hydrogen, hydroxyl, $C_6$-$C_{12}$ aryl, $C_3$-$C_{10}$ cycloalkyl, $C_1$-$C_{12}$ alkyl, halogen, $C_1$-$C_{12}$ alkoxy, $C_1$-$C_{12}$ alkylthio, $C_1$-$C_{12}$ haloalkyl, $C_6$-$C_{12}$ haloaryl, pyridyl, cyano, thiocyanato, nitro, amino, $C_1$-$C_{12}$ alkylamino, $C_1$-$C_{12}$ aminoalkyl, acyl, sulfonyl, sulfonate, phosphonate, amido, or carbamoyl, carboxylic acid, $C_1$-$C_{12}$ alkyl carboxylic acid ester, or sulfonic acid (—$SO_3H$).

7. The polymer of claim 4, wherein the co-monomer is

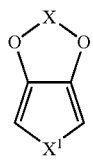

(XII)

wherein X is $C_1$-$C_4$ alkylene or substituted $C_1$-$C_4$ alkylene; and wherein $X^1$ is S, O, or N—$R^5$, wherein $R^5$ is hydrogen or $C_1$-$C_{12}$ alkyl.

8. The polymer of claim 4, wherein the co-monomer is

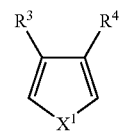

(XIII)

wherein $X^1$ is S, O, or N—$R^5$, wherein $R^5$ is hydrogen or $C_1$-$C_{12}$ alkyl; and wherein $R^3$ and $R^4$ are the same or different, wherein each is hydrogen, hydroxyl, $C_6$-$C_{12}$ aryl, $C_3$-$C_{10}$ cycloalkyl, $C_1$-$C_{12}$ alkyl, halogen, $C_1$-$C_{12}$ alkoxy, $C_1$-$C_{12}$ alkylthio, $C_1$-$C_{12}$ haloalkyl, $C_1$-$C_{12}$ haloalkoxy, $C_6$-$C_{12}$ haloaryl, or —$C_1$-$C_6$ alkyl-O—$C_1$-$C_6$ alkyl, or —$C_1$-$C_6$ alkyl-O—$C_6$-$C_{12}$ aryl.

9. The polymer of claim 4, wherein the co-monomer is

(XIV)

wherein $Q^1$ is S or O;

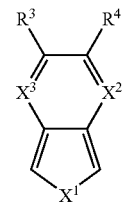

(XV)

wherein $X^1$ is S, O, N—$R^5$, wherein $R^5$ is hydrogen or $C_1$-$C_{12}$ alkyl, wherein $X^2$ and $X^3$ are the same or different and are CH or N, and wherein $R^3$ and $R^4$ are the same or different and wherein each is hydrogen, hydroxyl, $C_6$-$C_{12}$ aryl, $C_3$-$C_{10}$ cycloalkyl, $C_1$-$C_{12}$ alkyl, halogen, $C_1$-$C_{12}$ alkoxy, $C_1$-$C_{12}$ alkylthio, $C_1$-$C_{12}$ haloalkoxy, $C_1$-$C_{12}$ haloalkyl, $C_6$-$C_{12}$ haloaryl, —$C_1$-$C_6$ alkyl-O—$C_1$-$C_6$ alkyl, or —$C_1$-$C_6$ alkyl-O—$C_6$-$C_{12}$ aryl;

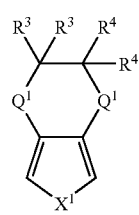

(XVI)

wherein $X^1$, $Q^1$, $R^3$, and $R^4$ are as previously defined, and wherein each occurrence of $Q^1$, $R^3$, or $R^4$ may be the same or different;

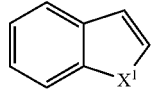
(XVII)

wherein $X^1$ is as previously defined;

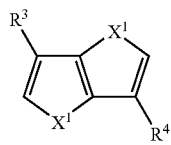
(XVIII)

wherein $X^1$, $R^3$, and $R^4$ are as previously defined, and wherein each occurrence of $X^1$ may be the same or different;

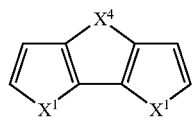
(XIX)

wherein $X^1$ and $X^4$ are as previously defined, and wherein each occurrence of $X^1$ may be the same or different;

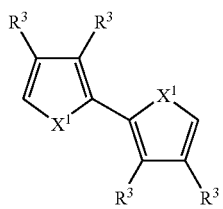
(XX)

wherein $X^1$ and $R^3$ are as previously defined, and wherein each occurrence of $X^1$ or $R^3$ may be the same or different;

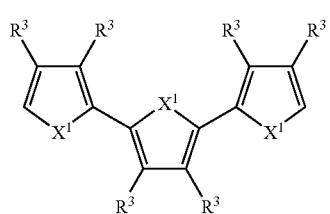
(XXI)

wherein $X^1$ and $R^3$ are as previously defined, and wherein each occurrence of $X^1$ or $R^3$ may be the same or different;

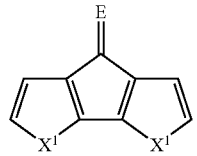
(XXII)

wherein $X^1$ is as previously defined, and wherein each occurrence of $X^1$ may be the same or different, and wherein E is O or $C(R^7)_2$, wherein each occurrence of $R^7$ is an electron withdrawing group;

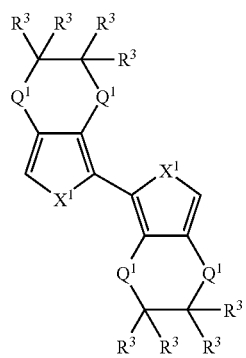
(XXIII)

wherein $X^1$, $Q^1$, and $R^3$ are as previously defined, and wherein each occurrence of $X^1$, $Q^1$, or $R^3$ may be the same or different;

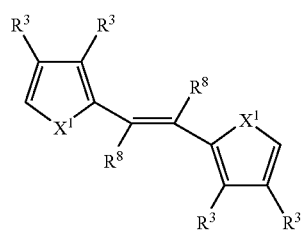
(XXIV)

wherein $X^1$ and $R^3$ are as previously defined, and wherein each occurrence of $X^1$ or $R^3$ may be the same or different, and
wherein each occurrence of $R^8$ is hydrogen, $C_1$-$C_6$ alkyl, or cyano;

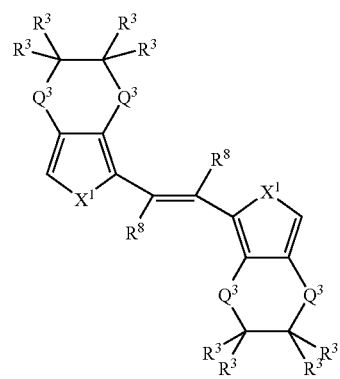
(XXV)

wherein $X^1$, $R^3$, and $R^8$ are as previously defined, wherein each occurrence of $X^1$, $R^3$, or $R^8$ may be the same or different, and
wherein each occurrence of $Q^3$ is independently $CH_2$, S, or O;

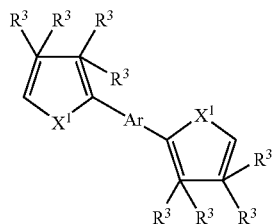
(XXVI)

wherein $X^1$ and $R^3$ are as previously defined, wherein each occurrence of $X^1$ or $R^3$ may be the same or different, and
wherein Ar is a furan, pyrrole, N-substituted pyrrole, phenyl, biphenyl, thiophene, fluorene, or 9-alkyl-9H-carbazole;

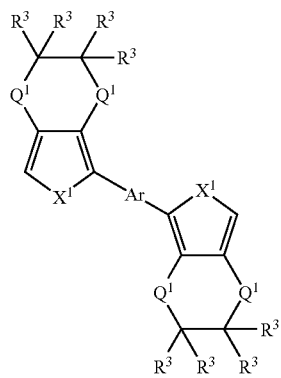
(XXVII)

wherein $X^1$, $Q^1$, $R^3$, and Ar are as previously defined, and wherein each occurrence of $X^1$, $Q^1$, or $R^3$ may be the same or different;

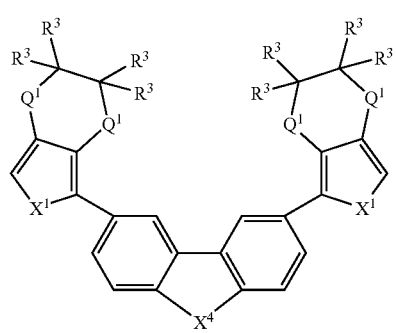
(XXVIII)

wherein $X^1$, $X^4$, $Q^1$, and $R^3$ are as previously defined, and wherein each occurrence of $X^1$, $Q^1$, or $R^3$ may be the same or different;

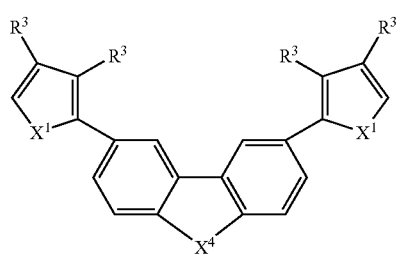
(XXIX)

wherein $X^1$, $X^4$, and $R^3$ are as previously defined, and wherein each occurrence of $X^1$ or $R^3$ may be the same or different;

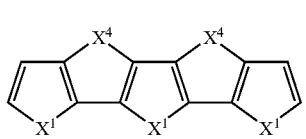
(XXX)

wherein $X^1$ and $X^4$ are as previously defined, and wherein each occurrence of $X^1$ or $X^4$ may be the same or different;

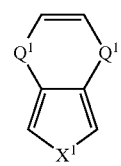
(XXXI)

wherein $X^1$ and $Q^1$ are as previously defined, and wherein each occurrence of $Q^1$ may be the same or different;

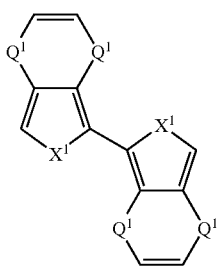
(XXXII)

wherein $X^1$ and $Q^1$ are as previously defined, and wherein each occurrence of $X^1$ or $Q^1$ may be the same or different;

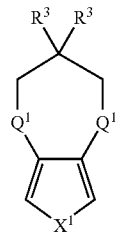

(XXXIII)

wherein $X^1$, $R^3$, and $Q^1$ are as previously defined, and wherein each occurrence of $R^3$ or $Q^1$ may be the same or different;

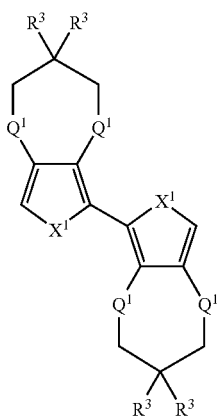

(XXXIV)

wherein $X^1$, $R^3$, and $Q^1$ are as previously defined, and wherein each occurrence of $X^1$, $R^3$, or $Q^1$ may be the same or different;

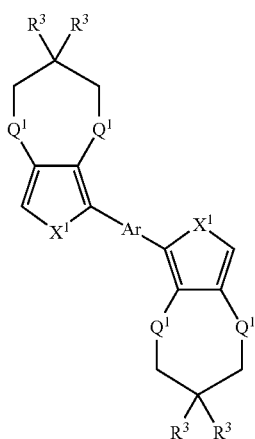

(XXXV)

wherein $X^1$, $R^3$, $Q^1$, and Ar are as previously defined, and wherein each occurrence of $X^1$, $R^3$, or $Q^1$ may be the same or different;

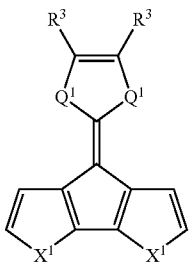

(XXXVI)

wherein $X^1$, $R^3$, and $Q^1$ are as previously defined, and wherein each occurrence of $X^1$, $R^3$, or $Q^1$ may be the same or different;

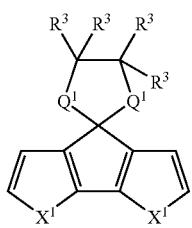

(XXXVII)

wherein $X^1$, $R^3$, and $Q^1$ are as previously defined, and wherein each occurrence of $X^1$, $R^3$, or $Q^1$ may be the same or different; or a combination comprising at least one of the foregoing co-monomers.

10. The polymer of claim 4, wherein the co-monomer is 3,4-ethylenedioxythiophene or pyrrole.

11. The polymer of claim 1, which has been doped with a p-dopant or an n-dopant.

12. The polymer of claim 1, which is dispersed in an aqueous or a non-aqueous solvent to form a dispersion.

13. The polymer of claim 1, wherein the polymer has a band gap of below about 1.3 eV.

14. An article comprising the polymer of claim 1.

15. A process, comprising:

polymerizing a monomeric composition comprising thieno[3,4-b]furan according to the structure (I), (II), or (III):

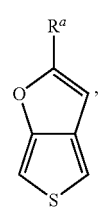

(I)

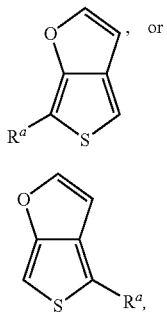

by electrochemical or chemical reaction to form a polymer, wherein $R^a$ is hydrogen, hydroxyl, $C_6$-$C_{12}$ aryl, $C_3$-$C_{10}$ cycloalkyl, $C_1$-$C_{12}$ alkyl, halogen, $C_1$-$C_{12}$ alkoxy, $C_1$-$C_{12}$ alkylthio, $C_1$-$C_{12}$ haloalkyl, $C_1$-$C_{12}$ haloalkoxy, $C_6$-$C_{12}$ haloaryl, pyridyl, cyano, thiocyanato, nitro, amino, $C_1$-$C_{12}$ alkylamino, $C_1$-$C_{12}$ aminoalkyl, acyl, sulfoxyl, sulfonyl, sulfonate, phosphonate, amido, or carbamoyl.

16. The process of claim 15, wherein electrochemical reaction is in an electrochemical cell comprising an electrolyte, a working electrode, a counter electrode, and a reference electrode in operable communication.

17. The process of claim 16, wherein the working electrode is a platinum, gold, or vitreous carbon working electrode, stainless steel and the counter electrode is platinum, stainless steel or gold.

18. The process of claim 16, wherein the working electrode is a vitreous carbon electrode and the electrolyte is tetrabutylammonium perchlorate/acetonitrile.

19. The process of claim 15, wherein the electrochemical reaction provides the polymer on an indium tin oxide substrate.

20. The process of claim 15, further comprising reducing the polymer.

* * * * *

UNITED STATES PATENT AND TRADEMARK OFFICE
CERTIFICATE OF CORRECTION

| | | |
|---|---|---|
| PATENT NO. | : 7,737,247 B2 | Page 1 of 1 |
| APPLICATION NO. | : 11/456606 | |
| DATED | : June 15, 2010 | |
| INVENTOR(S) | : Gregory A. Sotzing | |

It is certified that error appears in the above-identified patent and that said Letters Patent is hereby corrected as shown below:

Title Page,
Items (12) and (75), Inventor, remove "Stotzing" and replace with --Sotzing--

Column 1,
Line 11, insert --STATEMENT REGARDING FEDERALLY SPONSORED RESEARCH
The U.S. Government has certain rights to this invention pursuant to Grant No. 0349121 supported by the National Science Foundation.--

Signed and Sealed this
Fifteenth Day of November, 2011

David J. Kappos
*Director of the United States Patent and Trademark Office*